United States Patent [19]
Komori et al.

[11] Patent Number: 5,728,230
[45] Date of Patent: Mar. 17, 1998

[54] SOLAR CELL AND METHOD FOR MANUFACTURING THE SAME

[75] Inventors: Ayako Komori, Nara; Takahiro Mori, Ikoma; Ichiro Kataoka, Kyoto; Satoru Yamada, Kyoto; Hidenori Shiotsuka, Kyoto, all of Japan

[73] Assignee: Canon Kabushiki Kaisha, Tokyo, Japan

[21] Appl. No.: 689,653

[22] Filed: Aug. 13, 1996

[30] Foreign Application Priority Data

Aug. 15, 1995 [JP] Japan ................... 7-208253

[51] Int. Cl.$^6$ ................... H01L 31/048; H01L 31/18
[52] U.S. Cl. ................... 136/251; 136/259; 156/285; 156/286; 257/433; 438/64; 438/66
[58] Field of Search ................... 136/251, 259; 257/433; 437/2–5, 216, 219; 156/285–286; 438/64, 66–67

[56] References Cited

U.S. PATENT DOCUMENTS

| | | | |
|---|---|---|---|
| 5,578,141 | 11/1996 | Mori et al. | 136/251 |
| 5,582,653 | 12/1996 | Kataoka et al. | 136/251 |

FOREIGN PATENT DOCUMENTS

| | | | |
|---|---|---|---|
| 61-274373 | 12/1986 | Japan | 136/251 |
| 62-40783 | 2/1987 | Japan | 136/251 |

*Primary Examiner*—Aaron Weisstuch
*Attorney, Agent, or Firm*—Fitzpatrick, Cella, Harper & Scinto

[57] ABSTRACT

There is provided a highly reliable solar cell which is capable of retaining the adhesion either between a photovoltaic element and a reinforcing plate or an insulating film and between an insulating film and a reinforcing plate even under long-term outdoor exposure. An adhesive layer between the photovoltaic element and the reinforcing plate comprises a base resin and an adhesion-imparting resin.

30 Claims, 3 Drawing Sheets

000
SOLAR CELL AND METHOD FOR MANUFACTURING THE SAME

BACKGROUND OF THE INVENTION

1. Field of the Invention

The present invention relates to a solar cell module, and more specifically, to a back-face coating layer having a reinforcing member bonded via an adhesive layer to the non-light-receiving side surface of a solar cell module comprising a photovoltaic element having at least one semiconductor photoactive layer as a photoconversion member.

2. Related Background Art

Among the various known solar cells, thin film solar cells represented by an amorphous silicon solar cell with silicon deposited on a conductive metal substrate and a transparent conductive layer formed thereon are light in weight, resistant to shock, and very flexible, and accordingly is promising for future use as a module. In this case, however, the solar cell needs to be protected by coating the light-incident side surface with a transparent coating material, unlike the case where silicon is deposited on a glass superstrate. As this type of surface coating material, a transparent fluoride polymer thin film made of a fluorine containing resin film or a fluorine resin coating used for the top face has so far been employed together with various thermoplastic transparent organic resins used at its inner side.

The fluoride polymers used in such fashion are extremely weather resistant and water repellant, thereby reducing a decrease in the conversion efficiency of a solar cell module originating from a decrease in light transmittance due to yellowing or cloudiness caused by the deterioration of the resin and by surface stains. In addition, the thermoplastic transparent organic resins are inexpensive and can be used in a large amount as a filler for protecting the inner photovoltaic element.

In a practical solar cell module, a reinforcement is generally provided to retain the mechanical strength of the solar cell module and to prevent distortion or warping due to changes in temperature. It is necessary to bond the reinforcement to the conductive metal substrate having the semiconductor photoactive layer thereon and the thermoplastic transparent organic resin via an adhesive layer.

So far, as adhesives used for such an adhesive layer, a resin similar to the thermoplastic transparent organic resin used for the front surface coating material has been used. Furthermore, when an insulating film is further provided, a back-face coating layer with a thermoplastic transparent organic resin disposed thereon or thereunder is used.

FIG. 5 shows an example of such a conventional solar cell. In FIG. 5, 503, 502, 501, 504, and 505 denote a fluoride polymer thin film layer, a thermoplastic transparent organic resin, a photovoltaic element, an insulating layer, and a reinforcement, respectively. More specifically, the fluoride polymer thin film layer 503 is a film of a fluorine containing resin such as ETFE (ethylene-tetrafluoroethylene copolymer), PVF (polyvinyl fluoride) or the like; the thermoplastic transparent organic resin layer 502 is EVA (ethylene-vinyl acetate copolymer), butyral resin or the like; the insulating layer 504 is a film of various organic resin hard films such as nylon film, aluminum laminated Tedlar film or the like; and the reinforcement 505 includes insulated metal such as coated zinc steel plate, carbon fiber, FRP (glass fiber reinforced plastic) or the like. And in this example shown in FIG. 5, the thermoplastic transparent organic resin layer 502 plays a role of an adhesive for the photovoltaic element 501 with the fluoride polymer thin film layer 503 and the insulating layer 504 and for the insulating layer 504 with the back side of the photovoltaic element 501 and the reinforcement 505, and a role of a filler for protecting the solar cell from external scratches or shocks.

A solar cell module of such a structure is generally manufactured by stacking a resin film, a filler, a photovoltaic element, a filler, an insulating film, a filler, and a reinforcement, then pressing them together with the aid of a vacuum laminator and heating them.

So far, however, the thermoplastic transparent organic resin used for the adhesive layer of a back coating layer has had a problem in its adhesion. A conventional solar cell in which the conductive metal substrate and the reinforcement are bonded to each other with the above adhesive layer has had the following two problems:

A. In long-term outdoor use for 20 years or when used as a solar cell module integrated with a conductive metal substrate roofage of a house, it is indispensable to secure the adhesion with the reinforcement for a long period.

In a conventional structure of a back coating layer which uses a thermoplastic transparent organic resin, especially EVA as back organic polymer resin, the adhesion of EVA with the solar cell substrate and the reinforcement is weak. In particular, in a case of using a reinforcement such as coated zinc steel plate whose surface is covered with organic polymer, the adhesion is weak, thus causing peeling to easily occur at the interface. And when such a peeling occurs, there is another problem that moisture will reach the photovoltaic element through the peeled portion, thereby leading to not only a decrease in the electrical characteristics of the solar cell but also generation of, a leakage current through the moisture intruded in this manner. Furthermore, the initial adhesion is also weak and there is still another problem in reliability. Moreover, since the adhesion is found to further decrease in an accelerated environmental exposure test under an 85° C. and 85% humidity atmosphere, there is a great problem in long-term reliability.

Furthermore, in the above conventional solar cell in which insulation is provided by using a back insulating film, a high reliability is required for the adhesion between the conductive metal substrate and the back insulating film. Also, for the adhesion between a reinforcement provided to secure mechanical strength and to prevent distortions or warping due to temperature changes and the conductive metal substrate, a good degree of reliability is necessary.

B. In manufacturing a solar cell module by the above method, there are cases where the end of the solar cell module comes into close contact with the photovoltaic element and air is left in a part of its interior on application of pressure to the respective interfaces of the filler with the light-receiving side surface coating layer, the photoconversion member, the insulating film and the reinforcement. Accordingly, a manufactured solar cell often has air bubbles remaining inside it. In this manner, the air bubbles left inside a solar cell repeatedly are subject to expansion and compression with a change in temperature, thereby inducing peeling of the coating material. In addition, such peeling causes moisture to reach the photoconversion member, which in turn leads also to a decrease in conversion efficiency as mentioned above. Furthermore, the air bubbles mentioned above result in ruining the external appearance of the solar cell module, thereby lowering the yield of products.

As a means for solving the above problem B, a method of inserting glass fiber nonwoven fabric into both sides of individual fillers and laminating them is known. According to this method, glass fiber is inserted into the respective interfaces of the filler with the top surface resin film, the photoconversion member, the insulating film, and the reinforcement in the manufacturing process. For this reason, even under pressure applied to a solar cell, the escape of air is possible at the ends of the solar cell, so that evacuation is facilitated and the remaining air bubbles vanish. With this method, however, it becomes necessary to employ a very large quantity of glass fiber nonwoven fabric, thereby complicating the laminating operation and leading to a rise in the cost of the solar cell module as well.

SUMMARY OF THE INVENTION

It is an object of the present invention to provide a highly reliable solar cell module capable of providing the adhesion of a conductive metal substrate, an insulating layer, and a reinforcing plate with a thermoplastic transparent organic resin layer in a long-term outdoor exposure on the order of 20 years. And, it is a further object to provide a solar cell module enabling the manufacturing process to be simplified and having a high reliability concerning the degassing thereof during manufacturing.

As a result of repeated intensive research and development for solving the above problem, the inventors of the present invention found that the following composition is best:

That is, a solar cell module comprising a photovoltaic element comprising at least one semiconductor photoactive layer as a photoconversion member and a reinforcement bonded to the non-light-receiving face side of said photovoltaic element via an adhesive layer, wherein the adhesive layer is a back coating layer made by integrally stacking on both sides of a hard film an organic polymer resin comprising heat-sensitive adhesive resin layers comprising an adhesion-imparting resin.

Further, an arrangement with unevenness provided on the surface of the back coating layer may be used. As the hard film, a film made of polycarbonate, polyethylene terephthalate (PET), or nylon may be used. In addition, as the photovoltaic element, one having a semiconductor photoactive layer as a photoconversion member provided on a conductive metal substrate may be used.

With the adhesive material of the present invention according to the above arrangement, a strong adhesion of the substrate back face and the reinforcing plate in a solar cell module can be obtained.

In addition, when an insulating film is further provided between the solar cell and the reinforcing plate, the adhesion between the solar cell and the film and between the film and the reinforcing plate can be strengthened. Still further, the integral arrangement of the adhesive material and the insulating film according to the present invention simplifies the manufacturing process and enables the cost to be kept down.

In addition, by provision of unevenness on the surface of the back coating layer, nonwoven fabric for degassing may be dispensed with, so that a further simplification of the process steps and a further cost saving can be expected.

Furthermore, by using as the hard film, an inexpensive general-purpose resin film composed of polycarbonate, polyethylene terephthalate (PET), or nylon, the objects of the present invention can be achieved without a great increase in materials cost and the effect of the present invention can be enjoyed at a low cost.

In addition, by using as the photovoltaic element one having a thin film semiconductor layer provided on a metal substrate, the excellent flexibility of the photovoltaic element itself enables a flexible solar cell module to be easily manufactured by the combined use of a flexible coating material.

DETAILED DESCRIPTION OF THE PREFERRED EMBODIMENTS

Figure 1A:
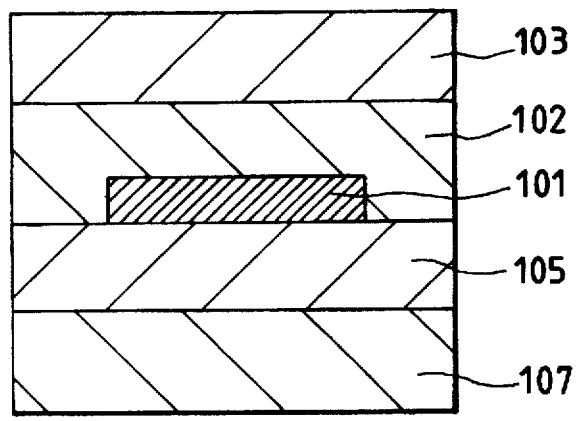
FIGS. 1A and 1B are schematic structural views of solar cell modules according to the present invention.
Figure 1B:
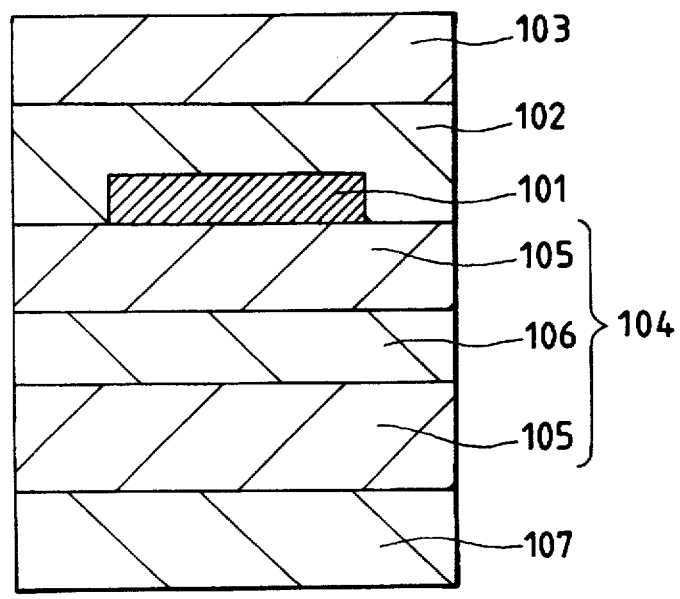

FIGS. 1A and 1B are schematic structural views of a solar cell module according to the present invention. In FIGS. 1A and 1B, 101, 102, 103, 104, 105, 106, and 107 denote a photovoltaic element, a transparent front surface filler, a transparent resin film located at the top surface, a back coating layer, an adhesive layer, an insulating film, and a reinforcing plate, respectively. With this solar cell module, light from the outside is incident on the resin film 103 at the top surface and reaches the photovoltaic element 101, and then an electromotive force produced at the photovoltaic element 101 is outputted through an output terminal (not shown) to the outside.

Adhesive Layer and Insulating Film

The adhesive layer 105 is made of a thermosetting resin mixed with an adhesion-imparting resin and this composition provides an extremely strong adhesion.

FIG. 1B shows a case where an insulating film 106 is provided between the solar cell and the reinforcing plate 107.

The back coating layer 104 is made by laminating the adhesive layers 105 on both sides of the insulating film 106. Accordingly, whereas three sheets of a filler, an insulating material, and a filler have so far been required, only one sheet of a back coating layer is necessary in the present invention, thereby simplifying the production steps to lead to cost reduction.

The insulating film 106 is necessary for maintaining the electric insulation between the photovoltaic element 101 and the outside. When the substrate of a solar cell is conductive, the insulating film essential, but even for a solar cell with an insulative substrate, the presence of an insulating film according to the present invention is preferable for improving the reliability. Accordingly, the insulating property of the insulating film has to be high. If it is low, electric insulation between the conductive substrate and the outside cannot be secured and safety comes into question concerning installation and use. Preferably, the dielectric breakdown voltage of the insulating film is 10 kV or higher. A preferable material for the insulating film is one which is capable of providing a sufficient electric insulation from the conductive metal substrate, is excellent in long-term durability, resistant to thermal expansion and thermal compression and very flexible. Preferred films include polycarbonate, polyethylene terephthalate, nylon, and the like.

The provision of unevenness on the surface of the adhesive layer permits easy degassing. It is preferable for the unevenness that the difference of elevation is 2 μm to 30 μm and the distance between adjacent peaks is 10 μm to 100 μm. Forming such a surface morphology enables air bubbles to be prevented from remaining inside during vacuum lamination without the use of glass nonwoven fabric.

As base materials for the adhesive layer, polyolefin type resins such as ethylene-vinyl acetate copolymer (EVA), ethylene-methyl acrylate copolymer (EMA), ethylene-ethyl acrylate copolymer (EEA), polyethylene, and butyral resin, urethane resins, silicone resins, and epoxy resins and the like having flexibility are used.

In the present invention, an adhesion-imparting resin is mixed in the base material resin in order to enhance the adhesion.

The property desired for an adhesion-imparting resin is that the softening point determined by the ring and ball method ranges from 50° C. to 100° C. If the softening point of the adhesion-imparting resin is high, insufficient fluidity is exhibited during lamination and it is difficult to coat the rugged back face of the conductive metal substrate. On the other hand, if the softening point is too low, the handling at room temperature becomes difficult and is unfavorable for use.

In particular, preferable adhesion-imparting resins include tackifier, cumarone-indene resin, phenol formaldehyde resin, polypentene resin, xylene formaldehyde resin, polybutene, rosin, rosin pentaerythritol ester, rosin glycerol ester (ester gum), hydrogenated rosin, hydrogenated rosin methyl ester, hydrogenated rosin pentaerythritol ester, hydrogenated rosin triethylene glycol ester, polymeric rosin, polymeric rosin derivatives, copolymer rosin, copolymer rosin derivatives, polymeric rosin ester, aliphatic petroleum resin, alicyclic petroleum resin, synthetic polyterpene, pentadiene resin, α-pinene, β-pinene, dipentene type resin, and terpene phenol resin.

The thickness of the adhesive layer 105 is preferably 50 μm to 1000 μm and more preferably 100 μm to 500 μm. With thinner adhesive layers, sufficient adhesion becomes unattainable and moreover levelling of the unevenness in the non-light-receiving face side of the conductive metal substrate becomes insufficient, so that the external appearance of the solar cell module becomes poor and the yield of products decreases. Also, for thicker adhesive layers, a problem arises in use with building materials because resin is flammable. In addition, there is also another problem from the standpoint of cost.

Photovoltaic Element

For the photovoltaic element 101 used in the present invention, any of single crystal, polycrystal, microcrystal, and amorphous semiconductors may be employed. For the semiconductor material, either Si or Si compounds may be used.

Above all, a solar cell using an amorphous Si semiconductor is appropriate on account or its low production cost, flexibility, and the like.

Figure 2:
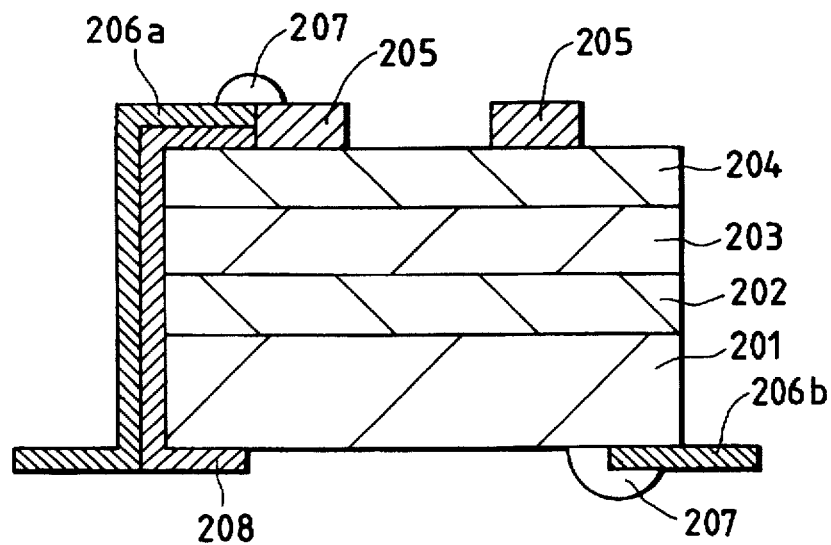
FIG. 2 is a sectional view showing the basic structure of a photovoltaic element employed in the solar cell modules of FIGS. 1A and 1B.

FIG. 2 shows a schematic structure of one example of a photovoltaic element. In FIG. 2, a photovoltaic element comprises a substrate 201, a back reflecting layer 202, a semiconductor layer 203, a transparent conductive layer 204, a collecting electrode 205, output terminals 206a and 206b, solder 207 and insulating tape 208.

Reinforcement

The role of the reinforcement is to increase the mechanical strength of the solar cell module and to prevent distortions or warping due to changes in temperature.

As for the reinforcement material, it is required that it have a good adhesion with the adhesive layer according to the present invention, is resistant to corrosion and weathering, and excellent in machinability. In particular, insulated steel plate with an organic polymer coating such as coated zinc steel plate, carbon fiber, FRP (glass fiber reinforced plastic), and the like are preferable.

Front Surface Filler

The front surface filler 102 is needed for coating the uneven surface of a photovoltaic element 101 with resin to protect it from severe outer environments such as temperature change, humidity, and shock and to retain the adhesion with the surface resin film 103 and the photovoltaic element 101. Accordingly, weather resistance, adhesion, filling property, thermal resistance, cold resistance, and shock resistance are required of the surface filler 102. As resins satisfying these requirements, polyolefin type resins such as ethylene-vinyl acetate copolymer (EVA), ethylene-methyl acrylate copolymer (EMA), ethylene—ethyl acrylate copolymer (EEA), or butyral resin, urethane resin, silicone resin, and the like are usable.

In particular, EVA has balanced physical properties for solar cell applications and is preferably used. However, because its heat deformation temperature is low, deformation or creep is manifested under a high temperature use if untreated, so that it is desired to improve the heat resistance by crosslinking. For EVA, it is sufficient to effect crosslinking with an organic peroxide.

Formation of the surface filler 102 is carried out by crosslinking and thermal pressure bonding while heating under pressure. The heating temperature and time can be decided in accordance with the thermal decomposition temperature characteristics of the respective organic peroxides. In general, with a temperature and time in which thermal decomposition proceeds by 90%, more preferably 95% or more, the heating and pressurizing can be completed.

For efficient progress of the crosslinking reaction mentioned above, triallyl isocyanurate (TAIC), called a crosslinking assistant, is desirably used.

Materials of the filler employed in the present invention are superior in weather resistance, but for further improvement in weather resistance or protection of the filler sublayer, a UV light absorber may be used jointly. As a UV light absorber, known compounds can be used, but considering the application environment of the solar cell module, it is preferable to use a low-volatility UV light absorber. With simultaneous addition of a light stabilizer, the filler becomes more stable to light.

Furthermore, an antioxidant may be added for improvement in thermal resistance and heat workability.

In addition, when use of the solar cell module under a severer environment is intended, it is preferable to improve the adhesion of the filler with a photovoltaic element or a surface film. Such improvement in adhesion is attainable by addition of a silane coupling agent or an organic titanate compound to the filler.

On the other hand, to minimize any decrease in the amount of light reaching the photovoltaic element, the surface filler should be transparent. Specifically, the light transmittance is desirably 80% or higher, more desirably 90% or higher in the visible light wavelength range of 400 nm to 800 nm, inclusive. In addition, to facilitate the incidence of light from the atmosphere, the refractive index at 25° C. ranges preferably from 1.1 to 2.0, more preferably from 1.1 to 1.6.

Transparent Surface Resin Film

Because of its being situated at the outermost layer of the solar cell module, the resin film 103 employed in the present invention should have characteristics needed for providing long-term reliability of the solar cell module in outdoor exposure, including weather resistance, dirt resistance, and mechanical strength. Materials preferably used in the present invention include fluorine resin and acrylic resin. In particular, fluorine resin is used by choice because of its excellent weather resistance and dirt resistance. "Fluorine resin" specifically includes polyvinylidene fluoride resin, polyvinyl fluoride resin, and ethylene tetrafluoride-ethylene copolymer. From the viewpoint of weather resistance, polyvinylidene fluoride resin is superior, but ethylene tetrafluoride-ethylene copolymer is superior from the viewpoint of compatibility between weather resistance and mechanical strength as well as transparency.

The transparent surface resin film is preferably 10 to 200 μm thick, more preferably 30 to 100 μm thick. Although a certain degree of thickness is required for securing the mechanical strength, excess thickness causes a problem from the viewpoint of cost.

For improvement of the adhesion with the filler mentioned above, it is preferable to apply a surface treatment such as corona treatment, plasma treatment, ozone treatment, UV irradiation, electron ray irradiation, and flame treatment.

A process for manufacturing a solar cell module by using the back coating layer, the photovoltaic element, the reinforcement, the filler, and the front surface transparent resin film mentioned above will be described hereinafter.

A front surface filler layer in sheet form and a back coating layer are prepared in advance. After inserting a front surface filler sheet 102 between the photovoltaic element 101 and the front surface transparent resin film 103 and inserting the back coating layer 104 between the photovoltaic element 101 and the reinforcement 107, a solar cell module can be manufactured by heating/pressure bonding. The heating temperature and the heating time during the heating/pressure bonding is determined on the basis of the temperature and time for allowing the crosslinking reaction to proceed sufficiently.

A method for heating/pressure bonding can be used which is selected from a great variety of known methods such as vacuum lamination and roll lamination.

EXAMPLES

Hereinafter, referring to the examples, the present invention will be described in detail.

Example 1

Photovoltaic element

First, an amorphous silicon (a-Si) solar cell (photovoltaic element) will be manufactured. The manufacturing procedure will be described referring to FIG. 2.

On a cleaned conductive substrate (stainless substrate) 201, an Al layer (500 nm in thickness) and a ZnO layer (500 nm in thickness) were formed in succession as a back reflection layer 202 by a sputtering method. Then, by a plasma CVD method, two unit cells each comprising an n-type a-Si layer, an i-type a-Si layer, and a p-type microcrystal μc-Si layer were formed respectively from a gas mixture of $SiH_4$, $PH_3$, and $H_2$, from a gas mixture of $SiH_4$ and $H_2$, and from a gas mixture of $SiH_4$, $BF_3$, and $H_2$ to form a tandem junction type a-Si semiconductor photoactive layer 203 with the following layer composition: 15 nm thick n-layer/400 nm thick i-layer/10 nm thick p-layer/10 nm thick n-layer/80 nm thick i-layer/10 nm thick p-layer. Next, as the transparent conductive layer 204, an $In_2O_3$ thin film (70 nm in thickness) was formed by resistance heating vapor deposition of In under an $O_2$ atmosphere. Then a collecting electrode (grid electrode) 205 was formed by the screen printing of silver paste. Finally, as the negative side output terminal 206b, a copper tab was attached to the stainless substrate by using solder 207, whereas a tin foil tape was attached to the collecting electrode 205 as the positive side output terminal 206a by using solder 207 and a photovoltaic element was obtained. Numeral 208 denotes an insulating tape for the prevention of a short circuit.

Series connection

Figure 3:
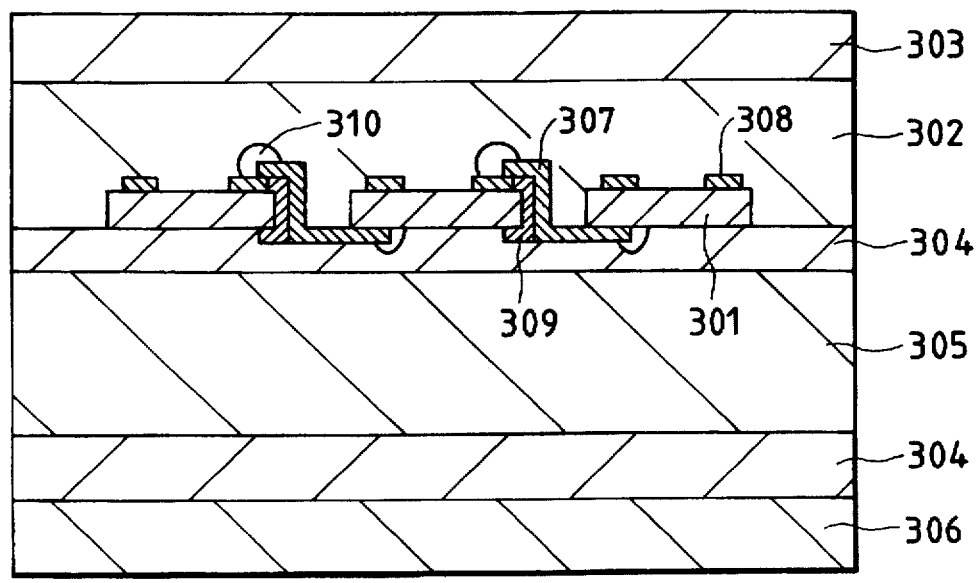
FIG. 3 is a sectional view showing a series connected solar cell array manufactured using the photovoltaic element of the structure shown in FIG. 2 in Example 1.

A method for manufacturing a solar cell array by connecting the photovoltaic elements manufactured as mentioned above in series will be described referring to FIG. 3.

After individual photovoltaic elements were placed side by side, the positive side output terminal 308 of one photovoltaic element and the negative side output terminal 309 of the other photovoltaic element in each pair of adjacent photovoltaic elements were connected with a copper tab 307 by using solder. In this manner, a solar cell array with three photovoltaic elements connected in series was obtained. At this time, a copper tab connected to the output terminal of the outermost end was turned to the back side in such a manner that the output could be taken out from the hole (described below) in the back coating layer.

Encapsulation

On the light-receiving face side of a cell array, an EVA sheet 302 (available from Springborn Laboratories Co., Trade Name PHOTO CAP, 460 μm in thickness) and a uniaxial oriented ETFE film 303 treated with corona discharge on one side (available from Du Pont, Trade Name TEFZEL T2 FILM), and on the back side, a glass fiber nonwoven cloth 304 (available from Crane Glass, Trade Name CRANE GLASS 230, 127 μm in thickness), an integrally laminated film 305 (available from GOTO Kasei K.K., two sided adhesive film, 500 μm in thickness (EEA 200 μm+PE 25 μ/PET 50 μm/PE 25 μm+EEA 200 μm)) and a black coated galvanium steel plate 306 (zinc plated steel plate, 0.27 mm) were stacked in the sequence of ETF film 303/EVA sheet 302/cell array 301/glass fiber nonwoven fabric 304/integrally laminated film 305/glass fiber nonwoven fabric 304/steel plate 306, and heated at 150° C. for 30 min while degassed under pressure by means of a vacuum laminator. In this way, a solar cell module was obtained.

The EVA sheet employed here is widely used as a sealing material for solar cells and was made by mixing 1.5 parts by weight of a crosslinking agent, 0.3 part by weight of a UV light absorbing agent, 0.1 part by weight of a light stabilizer, 0.2 part by weight of an antioxidant and 0.25 part by weight of a silane coupling agent to 100 parts by weight of EVA resin (vinyl acetate content of 33%). The output terminals were turned to the back face of the photovoltaic element in advance so that the output can be taken out from holes bored in advance on the galvanium steel plate.

For the solar cell module manufactured in accordance with the method mentioned above, evaluations were performed on the items described below:

Example 2

Sam as in Example 1, except that a nylon film (50 μm in thickness) was employed in place of PET for the insulating film of integrally laminated film 305 constituting the back coating layer.

Example 3

Same as in Example 1, except that a polycarbonate film (50 μm in thickness) was employed in place of PET for the insulating film of integrally laminated film 305 constituting the back coating layer.

Example 4

Except that an unevenness was provided on the surface of the integrally laminated film 305 as the back coating layer and the glass fiber nonwoven fabric was omitted in the back laminate structure, a solar cell module was manufactured in the same manner as in Example 1.

Example 5

Same as in Example 1, except that EMA (ethylene-methyl acrylate copolymer) was employed on place of EEA used for the integrally laminated film 305 constituting the back coating layer.

Example 6

Figure 4:
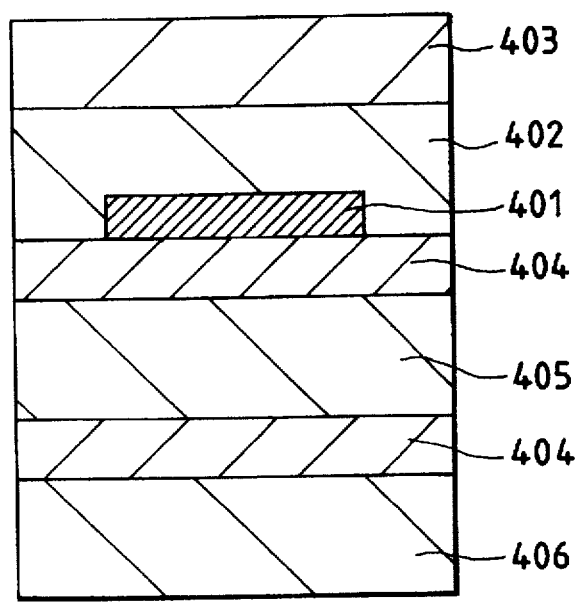
FIG. 4 is a sectional view of a solar cell module manufactured in Example 6.
Figure 5:
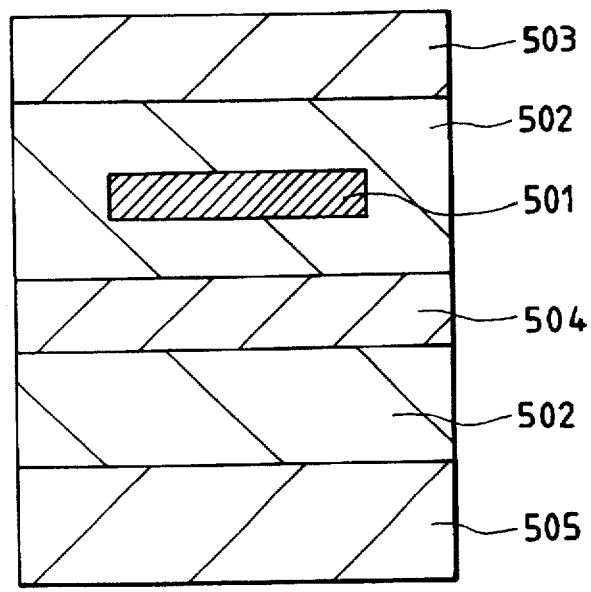
FIG. 5 is a sectional view showing an example of a conventional solar cell module.

Same as in Example 1, except that the components on the light-receiving side of the cell array were replaced with an EVA sheet 402 (available from Springborn Laboratories Co., Trade Name PHOTO CAP, 800 μm) and a white reinforced glass 403 (available from AFG, Trade Name Solatex, 3.2 mm). A solar cell module as shown in FIG. 4 was thus manufactured. In FIG. 4, numerals 401, 404, 405, and 406 denote a photovoltaic element, a glass nonwoven fabric, a back side integrally laminated film, and a reinforcement, respectively.

Comparative Example 1

Same as in Example 1, except that a 10 μm thick PET film was employed as the insulating film constituting the back coating layer.

Comparative Example 2

Same as in Example 2, except that a 10 μm thick nylon film was employed in place of the PET film as the insulating film constituting the back coating layer.

Comparative Example 3

Same as in Example 1, except that an integrally laminated film constituting the back coating layer was formed of 70 μm (EEA 5 μm+PE 5 μm/PET 50 μm/PE 5 μm+EEA 5 μm).

Comparative Example 4

Same as in Example 4, except that no unevenness was provided on the surface of the back coating layer.

The solar cell modules prepared in the examples and comparative examples mentioned above were evaluated for the following items. The results are shown in Table 1.

(1) Initial adhesion

By cutting the solar cell module in a width of 25 mm, test pieces were prepared. The respective ends of either the conductive metal substrate and an integrally laminated film or an integrally laminated film and a zinc plated steel plate were mounted on the clamp of a tensile machine (tensilon) such that the base members were pulled in mutually opposed directions (180 deg. peeling).

The testing machine was started at a peeling speed of 50 mm/min. After a peeling of about 50 mm from the start of peeling, the average value of each vertex in the wave part of a tensile load curve at the portion of a stable peeling force was taken as the adhesion. Table 1 shows the evaluation results where ⊚: excellent adhesion; o: adhesion being acceptable in practice; and x: insufficient adhesion.

(2) Electric Insulation

The positive electrode and the negative electrode of the solar cell module were shorted-circuited. With a DC voltage (high pot tester) connected between the short-circuited terminal and the reinforcement, leakage current under application of 2200V was measured and samples with a value of leakage current above 50 μA were judged "unacceptable". In Table 1, "acceptable" and "unacceptable" were denoted by o and x, respectively.

(3) Weather Resistance

With solar cell modules set in a sunshine weather meter, the accelerated weather resistance test was carried out by irradiation with light from a xenon lamp under a rainfall cycle. The change in external appearance after 5000 hours was observed. Samples without any change and samples with defects such as peeling or cracking affecting the reliability or appearance were denoted by o and x, respectively.

(4) Durability under a change in temperature

After a test cycle comprising a –40° C., 1 hour environment and an 85° C., 1 hour environment repeated 50 times, the external appearance of the solar cell modules was evaluated. The evaluation results are shown in Table 1 in accordance with the following evaluation criteria: That is, ⊚: no change at all in external appearance; o: some change in external appearance but allowable in practice; and x: defects such as peeling or cracks are observed which greatly affect the reliability or external appearance.

(5) Initial appearance

The initial appearance of the solar cell modules was evaluated by visual inspection. The evaluation results are shown in Table 1 in accordance with the following evaluation criteria: That is, ⊚: no change at all in external appearance; o: some change in external appearance but allowable in practice; and x: serious defects such as poor degassing or warpage of modules are observed.

TABLE 1

| | Adhesion | | Electric | Weather | Durability to a change in | Initial |
|---|---|---|---|---|---|---|
| | SUS substrate | Zinc plated | insulation | resistance | temp. | appearance |
| Example 1 | ⊚ | o | o | o | ⊚ | ⊚ |
| Example 2 | ⊚ | o | o | o | ⊚ | ⊚ |
| Example 3 | ⊚ | o | o | o | ⊚ | ⊚ |
| Example 4 | ⊚ | ⊚ | o | o | ⊚ | ⊚ |
| Example 5 | o | o | o | o | ⊚ | ⊚ |

TABLE 1-continued

|  | Adhesion | | Electric insulation | Weather resistance | Durability to a change in temp. | Initial appearance |
| --- | --- | --- | --- | --- | --- | --- |
|  | SUS substrate | Zinc plated | | | | |
| Example 6 | ⊚ | ○ | ○ | ○ | ⊚ | ⊚ |
| Comparative Example 1 | ⊚ | ○ | X | ○ | ⊚ | ⊚ |
| Comparative Example 2 | ⊚ | ○ | X | ○ | ⊚ | ⊚ |
| Comparative Example 3 | X | X | ○ | X | X | X |
| Comparative Example 4 | ○ | ○ | ○ | X | X | X |

As clearly seen from Table 1, each of the solar cell modules according to the present invention showed practically sufficient adhesion and high reliability in electric insulation. Furthermore, concerning both the initial appearance and the durability under changes in temperature, the inventive Examples showed no defects and were excellent in appearance.

In contrast to this, Comparative Examples 1 and 2 were poor in electric insulation, i.e., the insulating film was dielectrically broken down. On the other hand, Comparative Example 3 was poor in adhesion and appearance because, concerning the initial appearance, the unevenness in the back face of a module could not be absorbed. With respect to degassing, degassing could not be accomplished and air bubbles remained in the module of Comparative Example 4 in which no glass nonwoven fabric was used and there was no unevenness on the surface. When the temperature cycle test was performed on this module, it was observed that the portion with air bubbles was further swollen, and that not only the appearance was bad but also the reliability of the air bubble portions, i.e., the insufficiently filled portions, could not be assured.

The solar cell module manufacturing process according to the present invention is not limited to the above examples at all, but may be altered and modified variously within the essential points thereof.

What is claimed is:

1. A solar cell comprising an adhesive layer between a photovoltaic element and a reinforcing plate, wherein said adhesive layer comprises a base resin mixed with an adhesion-imparting resin.

2. A solar cell according to claim 1, wherein the softening point of said adhesion-imparting resin determined by the ring and ball method ranges from 50° C. to 100° C.

3. A solar cell according to claim 1, wherein said adhesion-imparting resin is rosin or a derivative thereof.

4. A solar cell according to claim 1, wherein said adhesion-imparting resin is at least one selected from the group consisting of tackifier, cumarone-indene resin, phenol formaldehyde resin, polypentene resin, xylene formaldehyde resin, polybutene, rosin, rosin pentaerythritol ester, rosin glycerol ester (ester gum), hydrogenated rosin, hydrogenated rosin methyl ester, hydrogenated rosin pentaerythritol ester, hydrogenated rosin triethylene glycol ester, polymeric rosin, polymeric rosin derivatives, copolymer rosin, copolymer rosin derivatives, polymeric rosin ester, aliphatic petroleum resin, alicyclic petroleum resin, synthetic polyterpene, pentadiene resin, α-pinene, β-pinene, dipentene type resin, and terpene phenol resin.

5. A solar cell according to claim 1, wherein said base resin is one selected from polyolefin type resin, urethane resin, silicone resin, and epoxy resin.

6. A solar cell according to claim 5, wherein said polyolefin type resin is one selected from EVA, EMA, EEA, polyethylene, and butyral resin.

7. A solar cell according to claim 1, wherein the thickness of said adhesive layer ranges from 50 to 1000 μm.

8. A solar cell according to claim 1, further comprising an insulating film between said photovoltaic element and said reinforcing plate.

9. A solar cell according to claim 8, wherein said adhesive layer is positioned between said photovoltaic element and said insulating film and/or between said insulating film and said reinforcing plate.

10. A solar cell according to claim 8, wherein the dielectric breakdown voltage of said insulating film is 10 kV or higher.

11. A solar cell according to claim 8, wherein said insulating film is one selected from polycarbonate, polyethylene terephthalate, and nylon.

12. A solar cell according to claim 8, wherein at least one surface of the insulating film has an adhesive layer formed integrally therewith.

13. A solar cell according to claim 1, wherein said photovoltaic element has a conductive substrate.

14. A solar cell according to claim 13, wherein said conductive substrate is made of stainless steel.

15. A solar cell according to claim 1, wherein said photovoltaic element comprises a non-monocrystalline semiconductor.

16. A solar cell according to claim 1, wherein said reinforcing plate is made of one selected from steel, carbon fiber, and FRP.

17. A process for manufacturing a solar cell comprising stacking up in the recited order on a reinforcing plate an adhesive layer comprising a base resin mixed with an adhesion-imparting resin, a photovoltaic element, a transparent filler, and a transparent resin film and bonding them together under heat and pressure.

18. A process for manufacturing a solar cell comprising stacking up on a reinforcing plate in the recited order a back-face coating layer comprising an adhesive layer comprising a base resin mixed with an adhesion-imparting resin provided on at least one surface of an insulating film, a photovoltaic element, a transparent filler and a transparent resin film and bonding them together under heat and pressure.

19. A process according to claim 18, wherein the dielectric breakdown voltage of said insulating film is 10 kV or higher.

20. A process according to claim 18, wherein said insulating film is one selected from polycarbonate, polyethylene terephthalate, and nylon.

21. A process according to claim 17 or 18, wherein the softening point of said adhesion-imparting resin determined by the ring and ball method ranges from 50° C. to 100° C.

22. A process according to claim 17 or 18, wherein said adhesion-imparting resin is rosin or a derivative thereof.

23. A process according to claim 17 or 18, wherein said adhesion-imparting resin is at least one selected from the group consisting of tackifier, cumarone-indene resin, phenol formaldehyde resin, polypentene resin, xylene formaldehyde resin, polybutene, rosin, rosin pentaerythritol ester, rosin glycerol ester (ester gum), hydrogenated rosin, hydrogenated rosin methyl ester, hydrogenated rosin pentaerythritol ester, hydrogenated rosin triethylene glycol ester, polymeric rosin, polymeric rosin derivatives, copolymer rosin, copolymer rosin derivatives, polymeric rosin ester, aliphatic petroleum resin, alicyclic petroleum resin, synthetic polyterpene, pentadiene resin, α-pinene, β-pinene, dipentene type resin and terpene phenol resin.

24. A process according to claim 17 or 18, wherein said base resin is one selected from polyolefin type resin, urethane resin, silicone resin, and epoxy resin.

25. A process according to claim 24, wherein said polyolefin type resin is one selected from EVA, EMA, EEA, polyethylene, and butyral resin.

26. A process according to claim 17 or 18, wherein the thickness of said adhesive layer ranges from 50 to 1000 μA.

27. A process according to claim 17 or 18, wherein said photovoltaic element has a conductive substrate.

28. A process according to claim 27, wherein said conductive substrate is made of stainless steel.

29. A process according to claim 17 or 18, wherein said photovoltaic element comprises non-monocrystalline semiconductor.

30. A process according to claim 17 or 18, wherein said reinforcing plate is made of one selected from steel carbon fiber, and FRP.

* * * * *

UNITED STATES PATENT AND TRADEMARK OFFICE
CERTIFICATE OF CORRECTION

PATENT NO.   : 5,728,230
DATED        : March 17, 1998
INVENTOR(S)  : AYAKO KOMORI ET AL.

It is certified that error appears in the above-identified patent and that said Letters Patent is hereby corrected as shown below:

COLUMN 2

Line 33, "of," should read --of--; and
    Line 53, "layer,," should read --layer,--.

COLUMN 14

Line 7, "$\mu A.$" should read --$\mu m.$--;
    Line 13, "comprises" should read --comprises a--; and
    Line 15, "steel" should read --steel,--.

Signed and Sealed this

Fifteenth Day of September, 1998

Attest:

BRUCE LEHMAN

Attesting Officer          Commissioner of Patents and Trademarks